Figure 1:
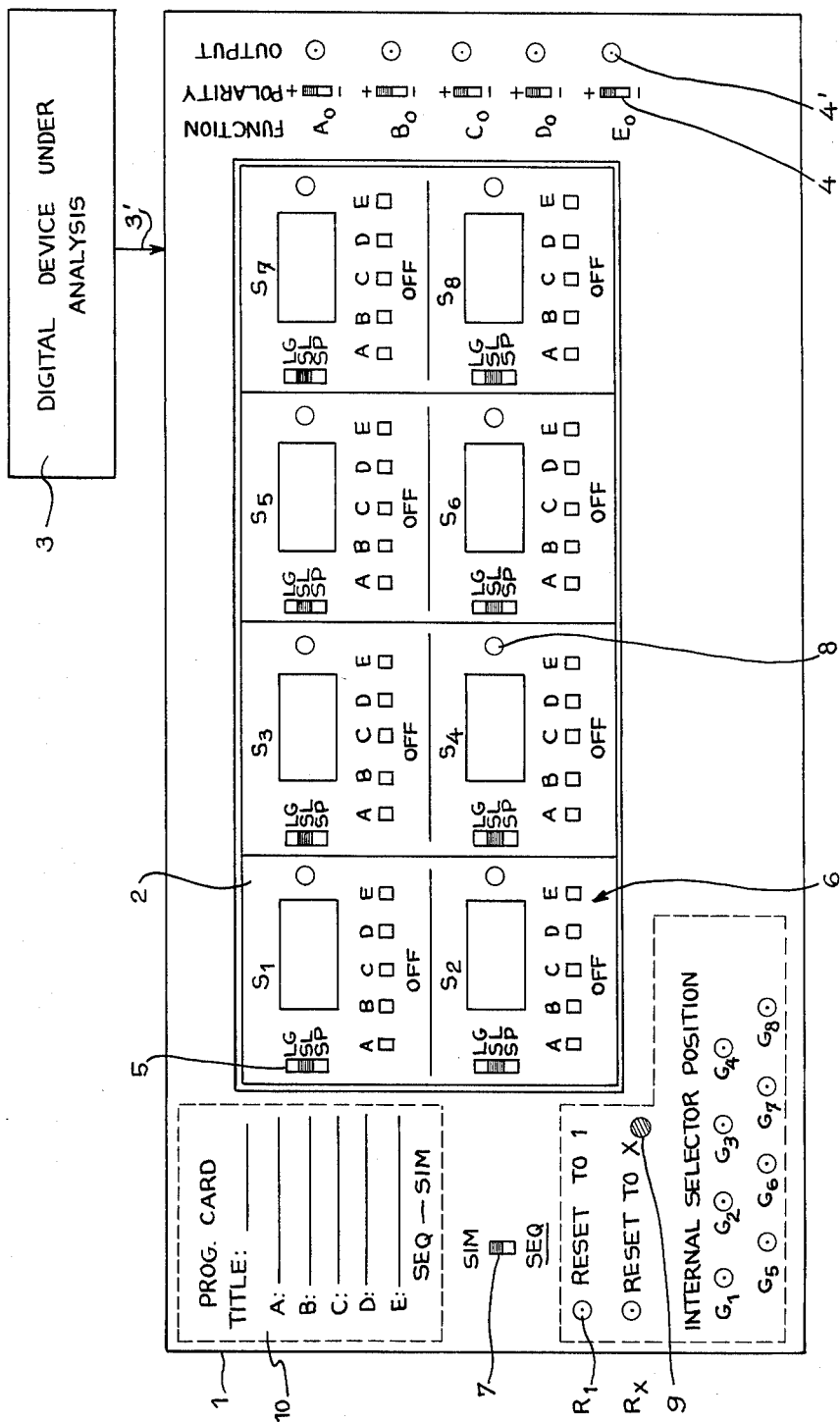

United States Patent [19]

Saint-Hilaire et al.

[11] 4,039,814
[45] Aug. 2, 1977

[54] REAL TIME PROGRAMMABLE DIGITAL REGISTER ANALYSER

[76] Inventors: Gilles Saint-Hilaire, 1743, rue Michel, Ste-Julie, Quebec, Canada, J0L 2C0; Jean-Marc Guay, 735 Marie Victorin, Boucherville, Quebec, Canada

[21] Appl. No.: 697,559

[22] Filed: June 18, 1976

[51] Int. Cl.$^2$ .................. H03K 5/18; G08B 29/00
[52] U.S. Cl. .................. 235/153 A; 235/153 AC; 235/153 AK
[58] Field of Search .... 235/153 A, 153 AC, 153 AK; 340/146.2

[56] References Cited

U.S. PATENT DOCUMENTS 3,892,955 7/1975 Maejima .................. 235/153 AC
3,988,603 10/1976 Griffin .................. 235/153 AC

*Primary Examiner*—R. Stephen Dildine, Jr.

[57] ABSTRACT

An apparatus is provided for analyzing output signals of digital devices. The apparatus comprises a plurality of comparison registers which evaluate the digital output signals, each comparison register including rotary switches for decoding the output signals under analysis. Programming switches permit to generate a function signal through at least one output channel provided in each comparison register when the output signals and the decoded value of said register are in a predetermined relationship. The operations of all comparison registers are selectively controlled by means of a logic circuit. As a result, a function signal is issued by the comparison register through a given channel in accordance with a predetermined program set by the switches and under the control of the logic circuit means, whenever a predetermined relationship exists between the output signals from the digital device under analysis and the value decoded on the comparison register.

17 Claims, 5 Drawing Figures

REAL TIME PROGRAMMABLE DIGITAL REGISTER ANALYSER

The present invention relates to digital signal analyzers and more particularly concerns an apparatus for analyzing output signals from digital devices, which apparatus operates to execute a set of given instructions set in the form of a program when the digital device output signals are at preselected values.

There is presently a definite trend to convert to digital form the output signal display of analog or scaling devices which represent parameters such as speed, voltage, frequency or of devices which operate as a counter, clock, calculator and so on. The numerical information enclosed in the output signals are usually further processed by printers or tracer units, in most cases. However, processing units able to render or interpret variations in output signals of less than 100 $\mu$sec are not actually widely available on a commercial basis.

On the other hand, the analyzing function of low duration signals is rather usually assigned to moderate size computers the response time of which is nevertheless restricted or handicapped by the time necessary to process a given program. A material delay in real time therefore occurs in the use of all but the more expensive computers, since changes in values of the output signal of the digital device and their analysis require, for sake of comparison, the use of several fixed value program registers along with the use of an internal processing program.

It is a prime object of the present invention to provide a digital output signal analyzing apparatus of relatively simple construction and which can be directly and easily programmed by an operator, thereby avoiding the necessity of learning and processing complicated computer codes.

By way of example, the analyzing apparatus in accordance with the present invention may work and be used in a large variety of applications. For instance, when utilized together with commercially available digital counters, this apparatus may operate as a digital clock, being then capable of generating complex sequences or series of variable time duration pulses. In this case, the length of such pulse sequences may range from hundreds of nano-seconds to thousands of hours while still maintaining a time accuracy within the nano-seconds. Moreover, at any instant during the processing of a given program, it is possible to input an external event for effectively interacting with the analyzing apparatus and thereby modifying the carrying out of that running program, or to cause the apparatus to switch on another analyzing program already set in other parts of the apparatus.

Also, the analyzing apparatus of the present invention may be used in conjunction with most electronic display devices such as digital frequency meters, volt-meters, clocks, calculators, thermometers, gauss meters, scalers, level meters and so on. In this case, the apparatus may control or execute specified processes which evolve in time or which are closely related to a branch logic, depending on the program selected by the operator on the analyzing apparatus. In any case, the analyzing apparatus of the present invention constitutes a relatively inexpensive alternative to costly complex computers as used in industrial and research works.

Therefore, the present invention resides in an apparatus for analyzing the output signals of digital devices, which is comprised of a plurality of comparison registers for evaluating the digital output signals, each comparison register including means for decoding said output signals under analysis until coincidence therewith is reached: program setting switching means allowing to generate a function signal through at least one output channel provided in each comparison register when said output signals and the decoded value of said register are in a predetermined relationship; logic circuit means for selectively controlling operation of said plurality of comparison registers, whereby the function signal is issued by the comparison register through a given channel in accordance with a predetermined program set by the switching means and under the control of the logic circuit means, the function signal being representative of the output signal from the digital device under analysis.

Figure 2:
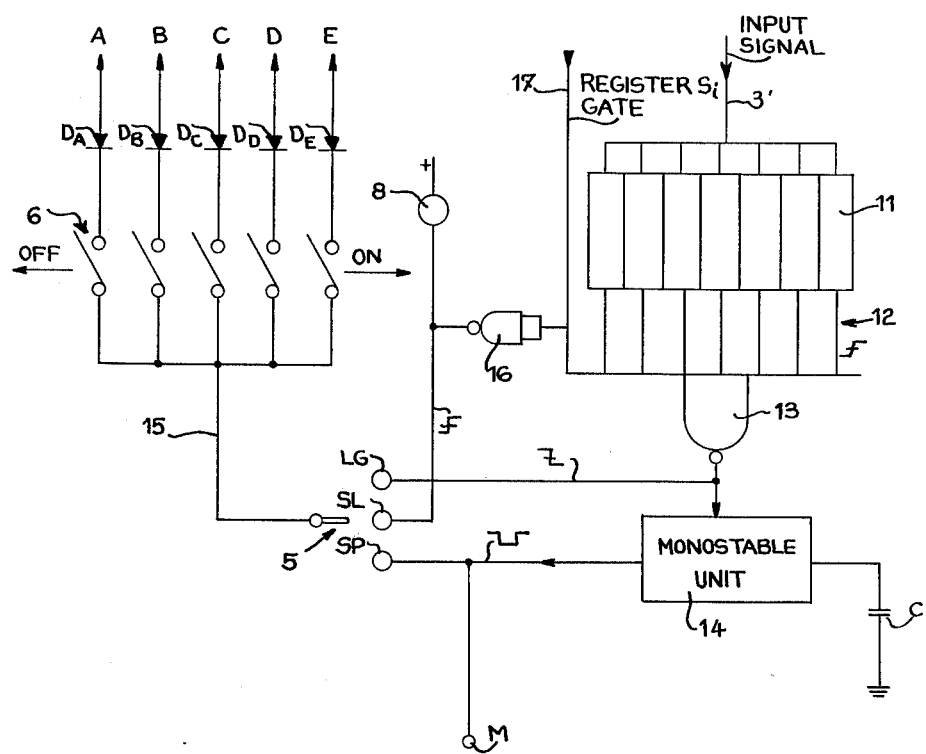
Figure 3:
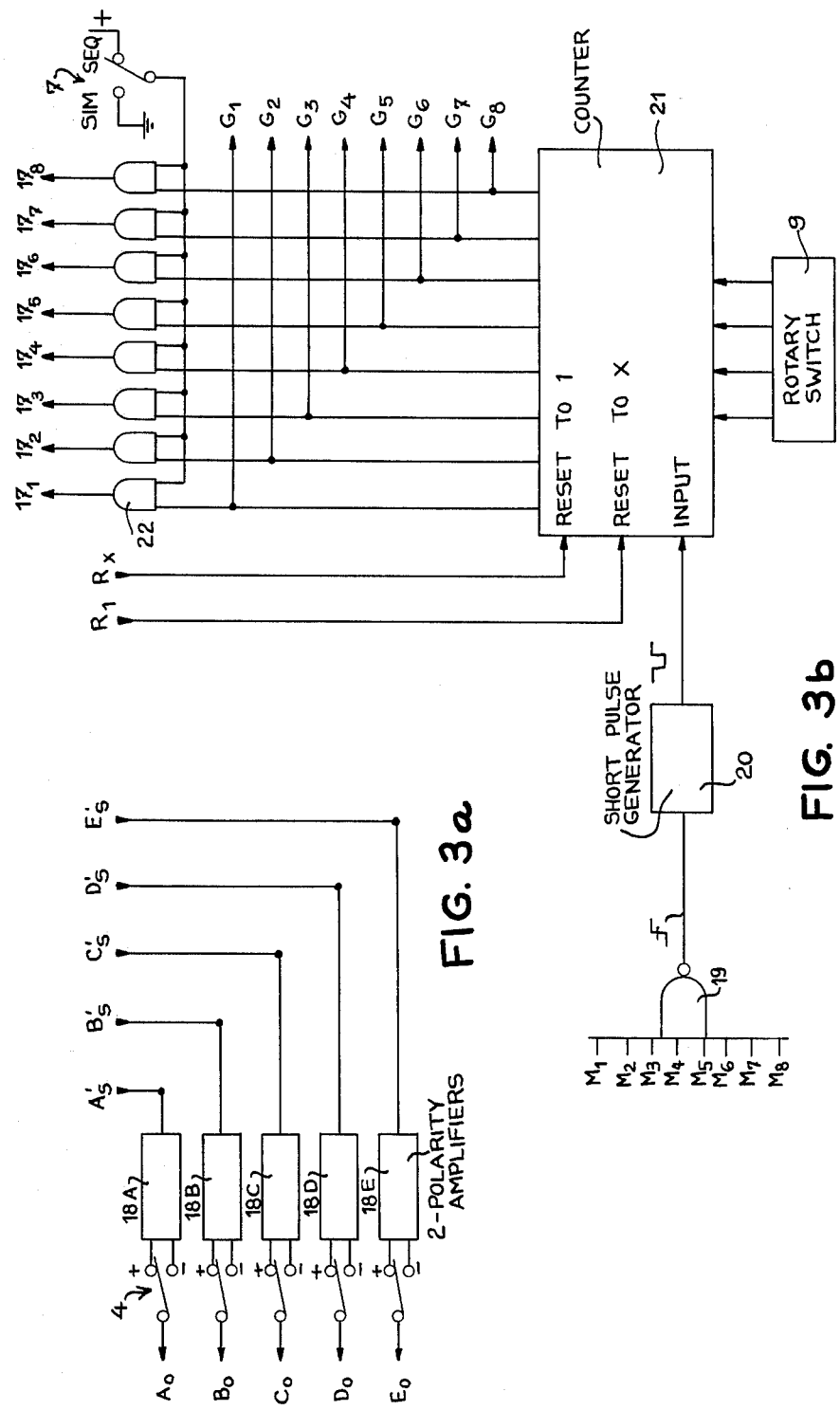
Figure 4:
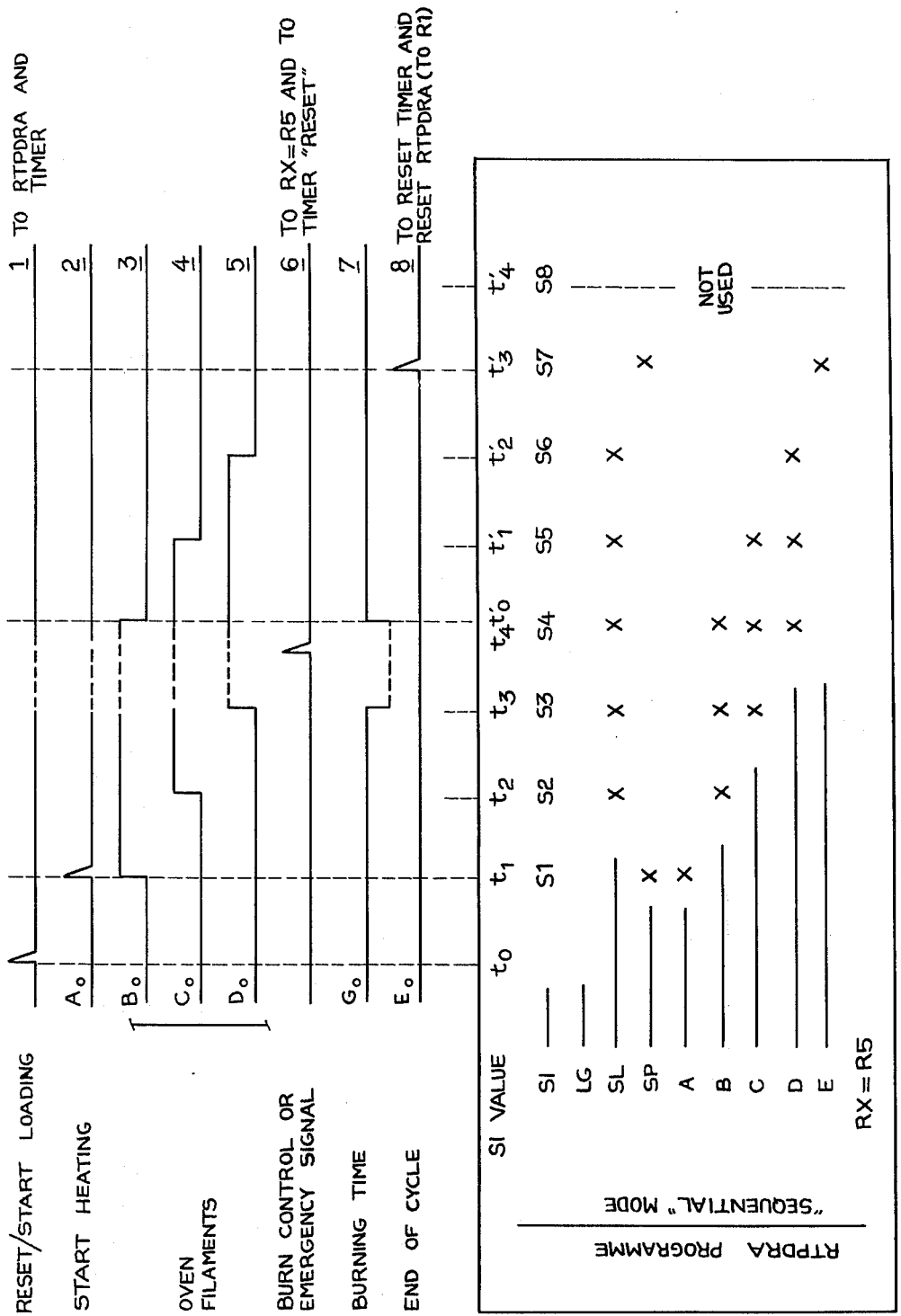

Preferred embodiments of the present invention will be hereafter described with reference to the accompanying drawings, wherein FIG. 1 schematically illustrates the front panel of the analyzing apparatus in accordance with the present invention, on which panel are disposed the various program setting switches and other elements serving to actuate and program the internal circuitry of the apparatus, in order to analyze the output signal of an external digital device;

FIG. 2 schematically depicts the logic circuitry associated with each comparison register of the analyzing apparatus;

FIG. 3A shows a circuit arrangement of the output channels for all comparison registers;

FIG. 3B schematically illustrates a main circuit for controlling operation and signal generation of the comparison registers;

FIG. 4 is the time chart illustrating an application of the analyzing apparatus when used in conjunction with a digital counter or timer for controlling the real-time heating and cooling cycles of an oven.

FIG. 1 generally shows an arrangement of the programming front panel of the analyzing apparatus of the present invention, that panel being so designed to provide easy access to all program setting switches and other programming elements by an operator. That analyzing apparatus is generally referred to as a real-time programmable digital register analyzer and designated in short by RTPDRA.

The analyzing apparatus is housed in a cabinet 1 and comprises eight comparison registers S1 to S8 which are paired, for sake of convenience, into four separate modules 2 of the plug-in type. In the present embodiment, each comparison register Si ($i = 1$ to 8) incorporates rotary switches (shown in FIG. 2) for decoding output signals from the digital device 3 under analysis.

The analyzing apparatus is adapted to generate simultaneously five programmed function signals in the form of pulse sequences $A_0$, $B_0$, $C_0$, $D_0$ and $E_0$ through their respective outlets 4' and each of a polarity selected by means of the two-position sliding switches 4. It is to be noted that comparison is effected in real time between the content of the external device 3 and the prefixed values on registers S1 to S8. Moreover, it is possible to achieve coincidence between external digital device 3 and the comparison registers whether the digital values of the device are increasing or decreasing in amplitude.

Two sets of program setting switches 5 and 6 are associated with each comparison register Si. The switch 5 is shown as being a three-position sliding switch whereas the set of switches 6 is made up of 5 individual push-button switches labelled A, B, C, D and E, each defining a channel through which a pulse is issued through a corresponding output 4′. On the other hand, the position of each programming switch 5 determines a particular pulse duration in all five channels of a particular comparison register Si.

When switch 2 is in the LOGIC position LG, one or more of the selected output channels of the individual comparison register Si remains "OFF" until coincidence with the external digital device 3 is reached. At coincidence, the register Si then switches the preselected channel "ON" for a time corresponding to the time duration of such coincidence, and then "OFF" again when the output signal of the device 3 changes and therefore coincidence has vanished.

The decoding duty signal from the individual register Si is different when switch 5 is in the SELECTOR LEVEL position SL. In this case, one or more of the output channels of Si are switched "ON" for the time interval during which the register decodes.

The SHORT PULSE selection SP of programming switch 5 allows the supply of a pulse having a time duration as short as 1 μsec or less, which pulse duration may be independently adjusted for each individual comparison register Si. The pulse length value will be referred to in greater details in the description of FIG. 2.

The analyzing apparatus of FIG. 1 is operative in two different modes according to the selection made by means of the two-position sliding switch 7: one being the simultaneous mode SIM, the other the sequential mode SEQ. Let us mention that two or more comparison registers may be made to coincide with the same output signal from the external device 3 in either mode. In the simultaneous mode SIM, all eight comparison registers S1 to S8 decode the digital output of device 3 simultaneously and each time coincidence is reached with a specific comparison register Si, a function signal is delivered through a channel determined by the programming switches 6 (ON or OFF positions) with a time duration governed by the position of programming switch 2, as explained above. Therefore, in the SIM mode, the output function signal could be produced through the fixed channels $A_0$, $B_0$, $C_0$, $D_0$ and $E_0$, which function and channels depend on the relative position of the programming switches 2 and 5 as well as on the variations of the output signal from the digital device 3. Since all comparison registers Si are decoding simultaneously, the decoding light indicators 8 of all comparison registers are turned on unconditionally.

In the SEQUENTIAL mode position of switch 7, the analyzing apparatus is provided with an internal counter (shown in FIG. 3B) which allows only one comparison register Si to operate at once. In this mode, coincidence with the output signal 3′ and the on-duty register is necessary before the following comparison register Si + 1 be activated. Also, the functions assigned to programming switches 2 and 5 are the same in the SEQ mode as in the SIM mode.

It is to be noted that whichever mode is chosen, two or more comparison registers S1 can be used on the same comparison register channel (A, for example) to build up the sequence of pulses at the respective function output 4′ (in this case $A_0$).

Furthermore, in the SEQ mode, the internal counter (FIG. 3B) is required to be reset to a proper value prior to the starting of the analysis by the analyzing apparatus. That resetting is performed by sending a pulse signal to R1 or RX, whether the comparison register S1 or SX is selected, where X is any value selected by means of the rotary switch 9. Let us mention that the reset signal prossesses an overriding priority and may re-position the analyzing apparatus to the selected comparison register, whatever the running program may be.

Internal selectors G1 to G8 are provided to supply electronically information about which corresponding comparison register Si is active at any given instant, in the SEQ mode. Moreover, the time elapsed between two or more successive coincidences can be evaluated from selectors G1 to G8 in either the SEQ or SIM mode. It may additionally be mentioned that, in the SEQ mode, the comparison registers being then activated sequentially, only one decoding indicator 8 is turned on at a time.

In order to ease the selection of the programming switches to carry out a given programme, a programme card 10 is affixed onto the front panel of the analyzing apparatus and onto which is recorded the position of the various switches 5, 6 and 7.

The general operation of the analyzing apparatus in accordance with the present invention having been described, we will now turn to FIG. 2 wherein there is shown the circuitry of a single comparison register Si. The output signal from the digital device 3 of FIG. 1 is forwarded through appropriate wiring to a set of 7 digital rotary switches 11 which form the basis of the comparison register Si. Within the binary coded decimal code received, each decoding switch requires 8 lines plus the common ground for digit recognition, and therefore, for 7 digit registers, the connecting cable 3′ must therefore carry 56 lines plus the ground.

Upon coincidence between the value decoded by the comparison register switches 11 and the digits of the input signal from the digital device 3, all the recognition levels 12 are then high so that the output of the AND-gate 13 is switched from a high to a low level. On the other hand, the decoding indicator 8 is turned "ON" to indicate that switches 11 are actually decoding, whenever a high level signal appears on line 17 from the register gate of FIG. 3B, an inverter 16 being provided between line 17 and indicator 8 to that effect.

With switch 5 in the LOGIC position LG, a coincidence event between the input signal and the decoding switches 11 brings line 15 from a high to a low level for a time period just corresponding to the time duration of such coincidence. On the other hand, the switch 5 at the SELECTOR level position SL, line 15 is kept at the low level as long as the register gate 17 is high, which means for a time interval as long as Si decodes. For switch 5 at the SHORT PULSE position SP, a monostable unit 14 brings line 15 to a low level as soon as coincidence is reached and will restore it to the high level only after a time corresponding to the time constant determined by capacitor C has elapsed.

The programming switches 6 allow the selection of channels A, B, C, D or E. The diodes DA, DB, DC, DD and DE form part of a passive adder from which the output pulse sequences $A_0$, $B_0$, $C_0$, $D_0$ and $E_0$ are made.

The monostable unit 14 also feeds a step selector gate shown in FIG. 3B through terminal M provided with each comparison register Si, whenever the output of the AND-gate 13 is low and for a time period determined by the time constant of capacitor C.

Turning now to FIG. 3A, there is shown a circuit arrangement for all the individual channels issued from each comparison register shown in FIG. 2. As illustrated, all "A" channels from the registers S1 to S8 are assembled into a main "A" channel, and so are the other channels B to E. The pulse sequences present in each main channel are amplified by a two-polarity amplifier 18 and then switched to the desired polarity by means of the switches 4, thereby forming the various output function signals $A_0$ to $E_0$.

FIG. 3B illustrates the main control circuit for controlling the operation of all the comparison registers. The signals delivered by the monostable unit 14 through the terminal M of each comparison register are fed all together to the input of a step selector gate which comprises an OR gate 19 wherein they are reassembled to drive the output of an internal counter 21 through the short-pulse generator 20. The counter 21 will therefore advance one step each time a pulse is detected by gate 19, this event occurring each time coincidence is detected by any Si and irrespectively of the operational mode selected on switch 7.

Moreover, the counter 21 may be reset to the value 1 by an external pulse applied on R1 whereas a pulse on RX will reset the counter 21 to a fixed value X which is also determined by the position of the rotary switch 9 (see also FIG. 1). The number of outputs of the counter 21 corresponds to the number of comparison registers under control and all outputs are in the high level except one which determines the counter position. Each of the eight output lines has an output tap G1 to G8 (see FIG. 1) and is connected to the input of an AND gate 22, that gate having another input linked to the mode selecting switch 7. The output of each gate 22, so-called register gate, is connected to line 17 provided in each register, as shown in FIG. 2, to deactivate all comparison registers save one, when the SEQUENTIAL mode is selected on switch 7.

An outstanding application of the analyzing apparatus of the present invention will now be described with reference to FIG. 4. Assuming that the timing cycle of an oven heated by three sets of filaments is to be controlled by three programmed functions, namely $B_0$, $C_0$ and $D_0$ corresponding to curves 3, 4 and 5, respectively, shown on FIG. 4.

The analyzing apparatus is in this case coupled to a digital electronic counter or timer which acts as the external digital device 3 represented in FIG. 1. Thus, the analyzing apparatus is first switched into the sequential mode and then the reset/start of the apparatus and of the external counter is done at time $t_0 = 0$ by an external command pulse indicated on line 1. A fixed time interval $t_0$ to $t_1$ is required for a loading/unloading operation, which is achieved by entering $t_1$ into the comparison register S1. Since the detection of $t_1$ is the unique function played by S1, any pulse type setting (LG, SL or SP) is optional on a given channel, say channel A. That selection provides the appearance of a pulse at the function output $A_0$ which can be used at will. The start of the pulse 2 from register S1 immediately activates the comparison register S2 at time $t_1$.

As only one oven filament is required to operate from $t_1$ to $t_2$, the comparison register S2 is set for coincidence with the counter at time $t_2$, its switch 5 is turned to the SELECTOR LEVEL setting SL and its channel B only is switched on. With the cessation of S1, the subsequent activation of register S2 causes a positive pulse to appear at the function output $B_0$. The length of the pulse emanating from channel B of S2 extends from $t_1$ to $t_2$, when S2 ceases to operate and S3 is activated immediately. The positive signal on 3 from $t_1$ to $t_2$ ensures the functioning of the filament controlled by $B_0$ for that time interval.

Two oven filaments are required to work during the interval $t_2$ to $t_3$. Continued operation of the first filament governed by $B_0$ is assured by programming S3 to operate on the SL setting through channel B. Thus, the positive pulse on $B_0$, started at $t_1$ by S2, is sustained past $t_2$ by the comparison register S3. With its channel C switched on as well, register S3 will also start the heating of the second filament governed by $C_0$ at time $t_2$ (line 4). The addition of a third filament at time $t_3$ requires the introduction of a new operation at this time. Hence $t_3$ is written into register S3 to cause its cessation when coincidence with the counter (timer) is reached.

At time $t_3$, the comparison register S4 starts to operate immediately. The same function commands as described in the above paragraph relatively to channels B, C and now D of S4 ensure the start of a BURN condition of the oven when all filaments operate simultaneously. Since the latter condition coincides with the decoding operation of the comparison register S4, its duration can be monitored through the internal selector tap G4 (see also FIGS. 2 and 3B).

The cooling cycle of the oven starts at time $t_4$. The time interval controlled by the activated register S5 is now designated $t'_0$ to $t'_1$ wherein only two filaments operate. Time $t_4$ has become the zero base of the new cooling time scale, i.e. $t_4 = t'_0$. Register S6 governs only one operating filament over time interval $t'_1$ to $t'_2$. Register S7 determines the interval, $t'_2$ to $t'_3$, necessary for the oven to cool down sufficiently so that safe unloading can be done.

Comparison register S7 is also programmed to generate a short pulse on its E channel at time $t'_3$. The corresponding pulse on $E_0$ can be used to automatically restart the complete warm-up and cooling cycle, or to trigger an other event outside the process controlled by the analyzing apparatus.

The normal warm-up and cooling cycle can be interrupted by an external signal 6. The programme then skips to comparison register S4 which corresponds to $t_4$. The start of the cooling cycle of the oven namely $t'_0$ to $t'_3$, is then begun immediately. In order to ensure that signal 6 has a non-destructive effect on the operation of the oven or its contents, an external blocking circuit should be mounted on the input to line 6 so that an emergency signal would appear only during the interval $t_2$ to $t_4$ and not at any other time.

The above example shows how pulse lengths of variable duration, from less than 1 μsec up to hours, can be assembled onto one or more function outputs $A_0$, $B_0$, $C_0$, $D_0$ and/or $E_0$. The external counting device does not need to operate sequentially in time as the counter (timer) used here. A duty cycle for regulating the burn operation can be envisaged where the analyzing apparatus contains a programme which is activated by a digital thermometer.

The analyzing apparatus can also be used in the SIMULTANEOUS mode for a wide variety of purposes, such as pulse sorting when a comparison register Si operates on the LOGIC setting. More than one analyzing apparatus in accordance with the present invention can operate simultaneously, in either the SIM or the SEQ mode, in parallel or in series with the external device, provided that appropriate interfaces between consecutive apparatuses are introduced.

We claim:

1. An apparatus for analyzing output signals of digital devices, comprising a plurality of comparison registers for evaluating the digital output signals, each comparison register including means for decoding the output signals under analysis; program setting switching means for generating a function signal through at least one output channel provided in each comparison register when said output signals and the decoded value of said register are in a predetermined relationship; and logic circuit means for selectively controlling operation of said plurality of comparison registers, whereby the function signal is issued by the comparison register through said channel in accordance with a predetermined program set by the switching means and under the control of the logic circuit means, the function signal being representative of said predetermined relationship between the output signals from the digital device under analysis and said decoded value of the comparison register.

2. An apparatus as claimed in claim 1, wherein said program switching means includes logic means for generating said function signal on occurrence of a coincidence between the value decoded by the decoding means and the signals from the digital device.

3. An apparatus as claimed in claim 2, wherein said logic means comprise an AND-gate.

4. An apparatus as claimed in claim 1, wherein said program switching means includes a logic means for generating said function signal up until coincidence is reached between the decoded value and the signals from the digital device.

5. An apparatus as claimed in claim 3, wherein said logic means is a logic inverter.

6. An apparatus as claimed in claim 1, wherein a pulse forming circuit is triggered by a logic element connected to said decoding means to generate said function signal through said program setting switching means whenever the decoded value is in coincidence with the value of the signal from the digital device.

7. An apparatus as claimed in claim 6, wherein said pulse forming circuit is a monostable circuit which is triggered by an AND-gate, the pulse generated by the monostable circuit having a predetermined time duration.

8. An apparatus as claimed in claim 1, wherein said logic circuit means include means for sequentially or simultaneously operating said plurality of comparison registers.

9. An apparatus as claimed in claim 8, wherein an input/output terminal for said apparatus is connected to each output of the counter.

10. An apparatus as claimed in claim 8, wherein the logic circuit means further include a plurality of logic gates each connected to an output of a digital counter and to the output of the operating means, the logic gates being of a number corresponding to the number of comparison registers used in the apparatus, and means to advance said counter by one step each time coincidence is reached between the digital device output signal value and the value decoded by one of said comparison registers.

11. An apparatus as claimed in claim 10, wherein means are provided to reset operation of said plurality of comparison registers by delivering a signal to an input of said counter to thereby initiate operation of a given comparison register.

12. An apparatus as claimed in claim 11, characterized in that an external signal is delivered to said counter to reset operation of said apparatus to the given comparison register.

13. An apparatus as claimed in claim 12, wherein said resetting means is a rotary switch connected to said counter.

14. An apparatus as claimed in claim 10, wherein the means to advance the counter by one step include a logic gate responsive to a signal issued from any one of the comparison registers, the output of said logic gate feeding a pulse generator which initiates the counter advance.

15. An apparatus as claimed in claim 10, wherein a light means is connected to the output of each logic gate through a logic inverter to indicate that the comparison register associated with said logic gate is decoding.

16. An apparatus as claimed in claim 1, wherein said plurality of comparison registers are paired to form a single plug-in unit.

17. An apparatus as claimed in claim 1, wherein all like channels of said plurality of comparison registers are gathered into a single main channel and wherein each main channel is connected in series with a two-polarity amplifier and a polarity selecting switch and to an outlet terminal of said apparatus.

* * * * *